(12) United States Patent
Martineau et al.

(10) Patent No.: US 12,341,635 B2
(45) Date of Patent: Jun. 24, 2025

(54) SYSTEM FOR GENERATING AT LEAST ONE RADIO FREQUENCY SIGNAL PHASE-LOCKED TO A REFERENCE SIGNAL, CORRESPONDING RADIO FREQUENCY TRANSMITTER AND RECEIVER

(71) Applicant: COMMISSARIAT A L'ENERGIE ATOMIQUE ET AUX ENERGIES ALTERNATIVES, Paris (FR)

(72) Inventors: Baudouin Martineau, Grenoble (FR); Dominique Morche, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 35 days.

(21) Appl. No.: 18/537,894

(22) Filed: Dec. 13, 2023

(65) Prior Publication Data

US 2024/0205059 A1 Jun. 20, 2024

(30) Foreign Application Priority Data

Dec. 16, 2022 (FR) ...................................... 22 13592

(51) Int. Cl.
*H04L 27/02* (2006.01)
(52) U.S. Cl.
CPC .................................. *H04L 27/02* (2013.01)
(58) Field of Classification Search
CPC ......... H04L 27/00; H04L 27/02; H04L 27/10; H04L 27/14; H04L 27/144; H04L 27/152;
(Continued)

(56) References Cited

U.S. PATENT DOCUMENTS 7,209,065 B2 * 4/2007 Wood .................... G04F 10/005
 341/155
7,236,060 B2 * 6/2007 Wood ................... H03B 5/1852
 327/292

(Continued)

OTHER PUBLICATIONS

Preliminary French Search Report issued Jul. 21, 2023 in French Application 22 13592 filed on Dec. 16, 2022, 9 pages (with English Translation of Categories of Cited Documents & Written Opinion).

(Continued)

*Primary Examiner* — James M Perez
(74) *Attorney, Agent, or Firm* — Oblon, McClelland, Maier & Neustadt, L.L.P.

(57) ABSTRACT

A system for generating a radio frequency signal phase-locked to a reference signal. Such a system includes a rotary travelling wave oscillator including a conductive ring and a plurality of sustaining amplifying cells electrically connected to the ring; a programmable multiplexer device designed to electrically connect an input port of the system to an amplifying cell that can be selected from the cells of the plurality. The system is designed so that the oscillator generates the locked radio frequency signal when the reference signal is injected at the input port of the system. A phase difference between the radio frequency signal and the reference signal is a function of the amplifying cell to which the input port is electrically connected via the programming of the multiplexer device.

10 Claims, 3 Drawing Sheets

(58) Field of Classification Search
CPC ... H04L 27/148; H04L 27/1525; H04L 27/18; H04L 27/20; H04L 27/2032; H04L 27/2053; H04L 27/206; H03B 5/08; H03B 5/12; H03B 5/1237; H03B 5/124; H03B 5/1246; H03B 5/1206; H03B 5/1212; H03B 5/1215; H03B 2200/006; H03B 2200/0078; H03L 7/06; H03L 7/08; H03L 7/10; H03L 7/101; H03L 7/102; H03L 7/099; H03L 7/0995; H03L 7/0996
See application file for complete search history.

(56) References Cited

U.S. PATENT DOCUMENTS

| | | | | |
|---|---|---|---|---|
| 7,741,921 | B2* | 6/2010 | Ismailov | H03B 27/00 331/96 |
| 7,973,609 | B2* | 7/2011 | Ohara | H03L 7/18 455/260 |
| 8,410,858 | B2* | 4/2013 | Wood | G06F 1/12 331/55 |
| 8,508,057 | B2* | 8/2013 | Schulte | H02N 11/008 290/1 R |
| 8,581,668 | B2* | 11/2013 | Martchovsky | H03B 5/1852 331/107 SL |
| 9,130,581 | B2* | 9/2015 | Morche | H03M 1/0653 |
| 9,143,136 | B2* | 9/2015 | Tekin | H03K 3/0315 |
| 9,191,129 | B2* | 11/2015 | Morche | H04B 17/00 |
| 9,531,430 | B2* | 12/2016 | Morche | H04L 25/4902 |
| 9,787,351 | B2* | 10/2017 | Martineau | H04B 1/18 |
| 10,044,102 | B2* | 8/2018 | Belot | H01Q 1/38 |
| 10,158,366 | B2* | 12/2018 | Galton | H03L 7/193 |
| 10,164,608 | B2* | 12/2018 | Belot | H03H 11/20 |
| 10,418,938 | B2* | 9/2019 | Martineau | H03L 7/04 |
| 10,665,945 | B2* | 5/2020 | Belot | H01Q 1/38 |
| 10,862,721 | B2* | 12/2020 | Siligaris | H03D 1/2245 |
| 11,171,656 | B2* | 11/2021 | Grout | H03L 7/087 |
| 11,588,514 | B2* | 2/2023 | Belot | H04B 1/40 |
| 11,614,512 | B2* | 3/2023 | Belot | G01S 7/4866 342/42 |
| 11,808,785 | B2* | 11/2023 | Martineau | H03F 3/72 |
| 11,855,585 | B2* | 12/2023 | Jany | H04L 27/02 |
| 12,028,081 | B2* | 7/2024 | Hu | H03B 5/124 |
| 12,092,677 | B2* | 9/2024 | Morche | G01R 29/0878 |
| 2007/0018739 | A1* | 1/2007 | Gabara | G06F 1/10 331/167 |
| 2007/0018740 | A1* | 1/2007 | Gabara | H03B 5/1228 331/167 |
| 2008/0074202 | A1* | 3/2008 | Gabara | H03B 5/1243 331/50 |
| 2008/0272952 | A1* | 11/2008 | Wood | G04F 10/005 341/166 |
| 2010/0066416 | A1* | 3/2010 | Ohara | H03L 7/099 327/107 |
| 2010/0117749 | A1* | 5/2010 | Beccue | H03B 5/1852 331/117 FE |
| 2011/0156773 | A1* | 6/2011 | Beccue | H03L 7/0995 327/156 |
| 2012/0039366 | A1* | 2/2012 | Wood | H03B 5/1852 343/893 |
| 2013/0120190 | A1* | 5/2013 | McCune, Jr. | H03B 5/1852 342/368 |
| 2013/0157584 | A1* | 6/2013 | Tekin | H03B 5/1228 331/109 |
| 2015/0311945 | A1* | 10/2015 | Morche | H04L 25/4902 375/147 |
| 2017/0126269 | A1* | 5/2017 | Baudouin | H04B 1/28 |
| 2017/0331181 | A1* | 11/2017 | Belot | H04B 1/04 |
| 2018/0069315 | A1* | 3/2018 | Belot | H01Q 1/38 |
| 2018/0138894 | A1* | 5/2018 | Belot | H10N 79/00 |
| 2019/0173582 | A1* | 6/2019 | Ashrafi | H04L 27/00 |
| 2020/0348395 | A1* | 11/2020 | Belot | G01S 7/032 |
| 2021/0293083 | A1* | 9/2021 | Tarng | F24F 11/89 |
| 2021/0391853 | A1* | 12/2021 | Jann | H03B 5/12 |
| 2022/0021339 | A1* | 1/2022 | Jany | H03C 3/40 |
| 2023/0046326 | A1* | 2/2023 | Hu | H03L 7/04 |
| 2023/0168288 | A1* | 6/2023 | Morche | G01R 29/0871 324/629 |
| 2023/0198468 | A1* | 6/2023 | Honkote | H03B 9/08 331/46 |
| 2024/0205059 | A1* | 6/2024 | Martineau | H03K 3/0315 |

OTHER PUBLICATIONS

Bai et al., "Low-Phase Noise Clock Distribution Network Using Rotary Traveling-Wave Oscillators and Built-In Self-Test Phase Tuning Technique", IEEE Transactions on Circuits and Systems—II: Express Briefs, vol. 62, No. 1, Jan. 2015, 5 pages.

Bai et al., "A Novel Injection Locked Rotary Traveling Wave Oscillator", 2014 IEEE Symposium on Circuits and Systems (ISCAS), Jun. 2014, 4 pages.

* cited by examiner

SYSTEM FOR GENERATING AT LEAST ONE RADIO FREQUENCY SIGNAL PHASE-LOCKED TO A REFERENCE SIGNAL, CORRESPONDING RADIO FREQUENCY TRANSMITTER AND RECEIVER

FIELD OF THE INVENTION

The field of the invention is that of generating phase-locked radio frequency signals. The invention relates more specifically to a system for generating such a signal.

Such a signal is used in many fields related to data transmission, for example via radio frequency, acoustic or optical links, in particular for generating synchronous clocks or for frequency transposition. The invention thus has applications, in particular, but not exclusively, in the field of mobile telecommunications (e.g. 4G, 5G networks or beyond such as defined by the 3GPP (3rd Generation Partnership Project)) or wireless local area networks (WLAN, e.g. using wifi), wireless broadband internet access (WiMAX), asymmetric digital subscriber line (xDSL), etc.

PRIOR ART AND ITS DRAWBACKS

In the remainder of this document, we describe an existing problem for beamforming in the field of data transmission via radio frequency links. The invention is not, of course, limited to this specific application but is of interest for all applications in which a phase-locked signal is used (for example for generating synchronous clocks).

Beamforming, a technique used in particular in 5G cellular standards and beyond, enables the transmitted energy to be better concentrated. Similar to the light from a bulb that is focused with a reflector, this technique allows greater distances to be reached and focuses the beam directly on the user rather than omnidirectionally.

This is achieved by subdividing a transmitter into a network of transmission chains, each transmission chain being connected to individual antennas and having the ability to modulate the phase of the transmitted signals. The same approach can be used for receiving signals.

To do this, one approach often used is to apply a phase shift to the signal used for frequency transposition, i.e. the signal commonly known as LO (for Local Oscillator) before it is applied to the various mixers in the transmission chains. This technique can be applied both for frequency transposition from low frequencies to the transmit frequency for a transmitter, or from the receive frequency to low frequencies for a receiver.

Various techniques are known to phase shift such a signal LO, which is in the radio frequency bands. By way of example, we can name certain techniques based on the use of passive phase shifters, in particular:

- a passive phase shifter technique based on implementing a high pass LC filter and a low pass LC filter that are switched alternately (switched type phase shifter). However, although such phase shifter topologies have proved feasible, their performance remains limited. Indeed, the phase shifters have to be cascaded to achieve the desired phase shift function. For example, a phase shifter covering 360 degrees with 22.5 degree steps requires a succession of 4 stages, resulting in high losses and reduced bandwidth;
- another passive phase shifter technique based on switching between transmission lines with different electrical lengths in discrete steps or, alternatively, on switching localized components to modulate the capacitive load on the line (loaded-line phase shifter). However, the resulting phase shift range is limited, generally less than 45 degrees;
- yet another passive phase shifter technique based on the use of a 90-degree coupler loaded by a variable load (reflection type phase shifter). More specifically, the quadrature coupler divides the input signal into a feed-through part and a coupled part with phase shifts of 0 degrees and 90 degrees. The signals reflected by the loads are combined in phase at the output (on the isolated port) giving the signal with the desired phase. The total phase shift range of such a phase shifter is determined by the phase range that can be achieved from the reflection coefficient produced by the load setting. However, the range of variation of such a load cannot be infinite and this type of coupler generally suffers from incomplete coverage of the trigonometric circle and/or a limited bandwidth since the 90 degrees of the coupler only exist at a given frequency (linked to the physical dimension of the coupler vs. the wavelength).

Alternatively, certain known techniques are based on the use of active phase shifters (also called vector modulators). Unlike passive phase shifters, active phase shifters can provide gain and a high phase resolution but suffer from non-linearities, a high level of noise and consume energy. Furthermore, the amplitude of the signal obtained by such active phase shifters often varies depending on the phase of the signal in question.

A technique is therefore needed to obtain a signal with a programmable phase shift over a wide range, ideally over the entire trigonometric circle. Such a technique must have limited losses and deliver a signal with constant amplitude.

DISCLOSURE OF THE INVENTION

In one embodiment of the invention, a system is proposed for generating one (or more) radio frequency signals phase-locked to a reference signal. Such a system comprises:

- a rotary travelling wave oscillator comprising at least one conductive ring and a plurality of sustaining amplifying cells electrically connected to said at least one ring, a radio frequency length of the ring loaded by an impedance of the amplifying cells corresponding to a frequency of the radio frequency signal(s);
- a programmable multiplexer device designed to electrically connect an input port of the system to at least one amplifying cell that can be selected from the cells of the plurality.

The system is designed so that the oscillator generates an oscillation signal phase-locked to the reference signal when the reference signal is injected at the input port of the system. A phase difference between the oscillation signal and the reference signal is a function of said at least one amplifying cell to which the input port is electrically connected via the programming of the multiplexer device. The radio frequency signal(s) correspond(s) to the oscillation signal picked up at a respective given point of said at least one ring.

The invention thus proposed a novel and inventive solution for generating one (or more) radio frequency signals (e.g. an unmodulated square wave signal) with a programmable phase shift over a wide range.

More specifically, the use of a ring-shaped rotary travelling wave oscillator or RTWO is used. Indeed, the phase of the oscillation signal within such an oscillator, when observed at different observation points covering the entire ring, has variations enabling the entire trigonometric circle to be covered. Likewise, the amplitude of the oscillation signal remains constant along the entire ring.

Furthermore, injecting a reference signal into a given amplifying cell locks the phase of the oscillation signal within the oscillator, and therefore the phase of the radio frequency signal(s) obtained. In this way, the phase of the oscillation signal observed at a given point of the ring can be controlled via the point at which the reference signal is injected into the ring. This is obtained by configuring the multiplexer device to inject the reference signal into the amplifying cell(s) corresponding to the desired phase.

In some embodiments, at least one sustaining amplifying cell comprises a variable capacitance. Thus, the radio frequency length of the ring, and therefore the frequency of the radio frequency signal(s) generated, is variable.

In some embodiments, the amplifying cells are evenly spread along the ring.

A constant phase increment of the radio frequency signal(s) is thus obtained when the reference signal is injected into the various amplifying cells.

In some embodiments, the oscillator comprises two conductive rings. The plurality of amplifying cells comprises an even number of amplifying cells. The amplifying cells are electrically connected to both rings in a differential arrangement.

In some embodiments, the oscillator comprises a single conductive ring. The plurality of amplifying cells comprises an odd number of amplifying cells. The amplifying cells are connected to the ring in an asymmetrical arrangement.

In some embodiments, the system is designed to generate the phase-locked radio frequency signal(s) when the frequency of the reference signal is the same as the frequency of the radio frequency signal(s) or an integer sub-multiple of the frequency of the radio frequency signal(s).

In some embodiments, the programmable multiplexer device is designed to electrically connect the input port of the system to a single amplifying cell that can be selected from the cells of the plurality.

In some embodiments, the programmable multiplexer device is designed to electrically connect the input port of the system to:
  a first amplifying cell that can be selected from the cells of the plurality; and
  a second amplifying cell that can be selected from the cells of the plurality.

The second cell is diametrically opposed to the first cell along said at least one ring. The reference signal injected at the second cell is inverted relative to the reference signal injected at the first cell.

In some embodiments, the system further comprises a sigma-delta modulator delivering a stream of binary words belonging to a finite set of binary words representing N numerical values. The programmable multiplexer device is designed to electrically connect, as a function of the stream of binary words, the input port of the system to one of the N amplifying cells that can be selected from the cells of the plurality. The N amplifying cells are successive cells along the ring, each amplifying cell among the N amplifying cells being associated with a respective value among the N numerical values. The reference signal is injected at a given amplifying cell among the N amplifying cells when a binary word delivered by the sigma-delta modulator represents a value corresponding to the value associated with the given amplifying cell.

As a result of the low-pass effect of the oscillator with respect to the injected reference signal, a phase increment is obtained that is a fraction of the phase increment obtained when the reference signal is simply injected into any one of the amplifying cells.

In some embodiments, the system is designed to generate the phase-locked radio frequency signal(s) when the frequency of the stream of binary words is the same as the frequency of the reference signal or an integer sub-multiple of the frequency of the reference signal. For example, the power consumption of the system is reduced when the frequency of the stream of binary words is the same as an integer sub-multiple of the frequency of the reference signal.

The invention further relates to a radio frequency transmitter comprising:
  a frequency synthesizer delivering a reference signal;
  a plurality of generating systems as described above (according to any one of the aforementioned embodiments). Each system generates at least one respective radio frequency signal phase-locked to the reference signal, the multiplexer device of each system being programmed so that the radio frequency signals generated by the various systems of the plurality have a relative phase gradient between them;
  a plurality of frequency transposition devices each supplied from at least one respective radio frequency signal and delivering a respective signal to be transmitted from a given low-frequency signal.

Transmit beamforming can thus be achieved simply and efficiently.

The invention further relates to a radio frequency receiver comprising:
  a frequency synthesizer delivering a reference signal;
  a plurality of generating systems as described above (according to any one of the aforementioned embodiments). Each system generating at least one respective radio frequency signal phase-locked to the reference signal, the multiplexer device of each system being programmed so that the radio frequency signals generated by the various systems of the plurality have a relative phase gradient between them;
  a plurality of frequency transposition devices each supplied from at least one respective radio frequency signal and delivering a respective low-frequency signal from a received signal. Receiver beamforming can thus be achieved simply and efficiently.

LIST OF THE FIGURES

Other aims, features and advantages of the invention will become clearer upon reading the following description, which is given merely as an illustrative and non-limiting example, with reference to the figures, in which.

DETAILED DESCRIPTION OF EMBODIMENTS OF THE INVENTION

The general principle of the invention is based on a system using a ring-shaped RTWO in which a reference signal can be injected at different points of the ring. The system is designed so that the RTWO generates an oscillation signal phase-locked to the reference signal. Thus, the phase of the oscillation signal, when observed at different points of the ring, has variations covering the entire trigonometric circle. Likewise, the amplitude of the oscillation signal remains constant along the ring.

Furthermore, the phase of the oscillation signal observed at a given point of the ring can be controlled via the point at which the reference signal is injected into the ring. The same applies to at least one radio frequency signal generated by picking up the oscillation signal at a given point of the ring.

Figure 1:
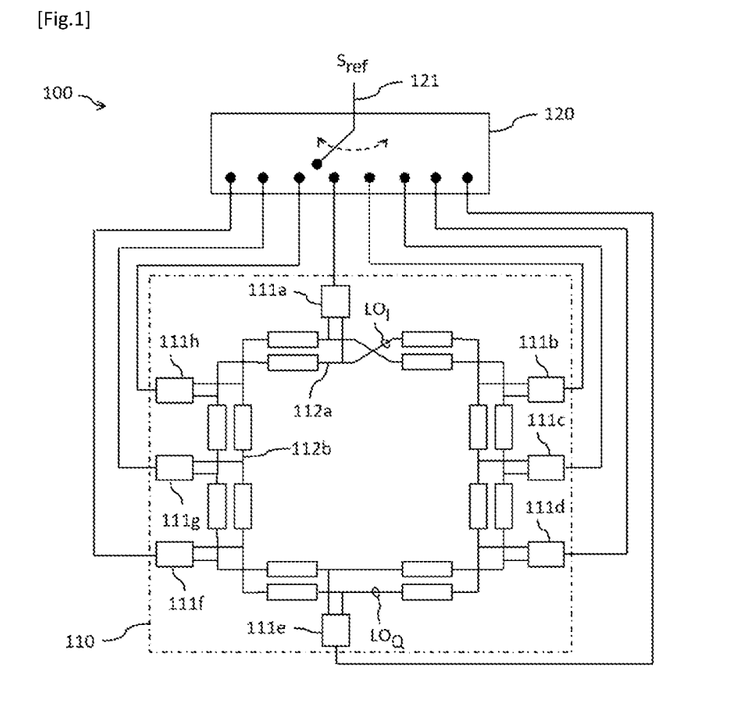
FIG. 1 shows a system for generating a radio frequency signal phase-locked to a reference signal according to one embodiment of the invention.

A system 100 is now presented, with reference to [FIG. 1], for generating two radio frequency signals $LO_I$, $LO_Q$, phase-locked to a reference signal $S_{ref}$ according to one embodiment of the invention.

More specifically, the system 100 comprises:
an RTWO 110 comprising two conductive ring 112a, 112b and eight sustaining amplifying cells 111a, 111b, 111c, 111d, 111e, 111f, 111g, 111h electrically connected to the two rings 112a, 112b;
a programmable multiplexer device 120 designed to electrically connect an input port 121 of the system 100 to an amplifying cell that can be selected from the eight amplifying cells 111a, 111b, 111c, 111d, 111e, 111f, 111g, 111h.

The system is designed so that the RTWO 110 generates a differential oscillation signal phase-locked to the reference signal $S_{ref}$ when the reference signal $S_{ref}$ is injected at the input port 121. The phase difference between the oscillation signal and the reference signal $S_{ref}$ is a function of the amplifying cell 111a (or 111b or 111c or 111d or 111e or 111f or 111g or 111h) to which the input port 121 is electrically connected via the programming of the multiplexer device 120. Such a phenomenon of phase-locking by injection is known per se.

Two radio frequency signals $LO_I$, $LO_Q$ are generated by picking up the oscillation signal at respective given points of the two rings (in this case diametrically opposed points). However, in other embodiments, a single radio frequency signal is generated by picking up the oscillation signal at a given point of the two rings. In other embodiments, more than two radio frequency signals are generated by picking up the oscillation signal at respective given points of the two rings.

Furthermore, according to the hardware implementation under consideration, the system 100 is designed to generate the phase-locked radio frequency signal(s) when the frequency of the reference signal $S_{ref}$ is the same as the frequency of the radio frequency signal(s) or an integer sub-multiple of the frequency of the radio frequency signal(s).

For example, the phase noise of the radio frequency signal(s) generated is the same as the phase noise of the reference and no longer the same as the oscillator's own phase noise when the frequency of the reference signal $S_{ref}$ is the same as the frequency of the radio frequency signal(s). When the frequency of the reference signal $S_{ref}$ is the same as an integer sub-multiple of the frequency of the radio frequency signal(s), the phase noise is then the same as the phase noise of the reference plus 20 log(N), N being the ratio between the frequency of the signal and the frequency of the reference signal $S_{ref}$.

Returning to [FIG. 1], the eight amplifying cells 111a, 111b, 111c, 111d, 111e, 111f, 111g, 111h are evenly spread along the two rings 112a, 112b. A constant phase increment of the radio frequency signals $LO_I$, $LO_Q$ is thus obtained when the reference signal $S_{ref}$ is injected into the various amplifying cells. More specifically, the oscillation conditions within the RTWO mean that the phase of the oscillation signal of the RTWO 110 varies by 180 degrees when observed at different observation points covering the entire circumference of the rings 112a, 112b. Thus:
when the multiplexer device 120 is designed to electrically connect the input port 121 to a given amplifying cell, for example the cell 111a, a first phase of the radio frequency signals $LO_I$, $LO_Q$ generated is obtained; and
when the multiplexer device 120 is designed to electrically connect the input port 121 to the next amplifying cell of the given cell along the rings 112a, 112b, for example the cell 111b, a second phase of the radio frequency signals $LO_I$, $LO_Q$ generated is obtained.

Figure 3:
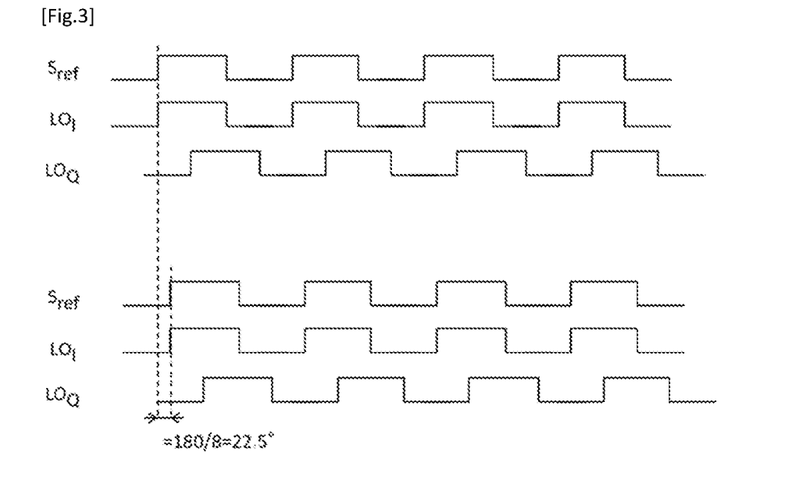
FIG. 3 shows exemplary radio frequency signal phases obtained for a first and for a second configuration of the programmable multiplexer device of the system of [FIG. 1]

It can then be seen that the phase difference between the second phase and the first phase is equal to 180/8=22.5 degrees. A configuration of this type corresponds to the signals respectively shown on the top and bottom of [FIG. 3]. Furthermore, the two radio frequency signals $LO_I$, $LO_Q$, corresponding to the oscillation signal observed at diametrically opposed points of the two rings 112a, 112b, have a phase difference of 90 degrees. The signals $LO_I$, $LO_Q$, picked up at such diametrically opposed points of the two rings 112a, 112b, can be used, for example, as signals for frequency transposition by supplying quadrature mixers as discussed below with reference to [FIG. 5] and [FIG. 6].

In other embodiments, the amplifying cells are not evenly spread along the rings. In this case, a non-constant phase increment of the radio frequency signal(s) is obtained when the reference signal is injected into the various amplifying cells.

Returning to [FIG. 1], the radio frequency length of the rings 112a, 112b loaded by the impedance of the amplifying cells 111a, 111b, 111c, 111d, 111e, 111f, 111g, 111h corresponds to the frequency of the oscillation signal obtained within such an oscillator, and therefore to the frequency of the radio frequency signal(s) thus generated. In particular, the capacitive part of the impedance in question influences the radio frequency length of the loaded rings 112a, 112b. Thus, in some embodiments such as the embodiment shown in [FIG. 2], such an amplifying cell 111a (or 111b or 111c or 111d or 111e or 111f or 111g or 111h) comprises a variable capacitance. Thus, the radio frequency length of the rings 112a, 112b, and therefore the frequency of the radio frequency signal(s) generated, is variable. Depending on the implementations, all or some of the cells 111a, 111b, 111c, 111d, 111e, 111f, 111g, 111h of the system 100 comprise such a variable capacitance.

Figure 2:
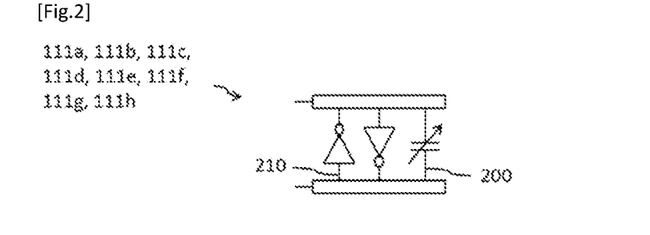
FIG. 2 shows an exemplary structure of a sustaining amplifying cell implemented in the system of FIG. 1 according to one embodiment of the invention.

Furthermore, in the embodiment shown in [FIG. 2], the amplifying cell 111a (or 111b or 111c or 111d or 111e or 111f or 111g or 111h) comprises two inverters 210 electrically connected in reverse polarity to the two conductive rings 112a, 112b of the RTWO 110. The two inverters 210 implement the oscillation sustaining amplifying function of the RTWO 110. However, in other embodiments, other known amplifying structures are used in order to implement the oscillation sustaining amplifying part of the RTWO 110.

Returning to [FIG. 1], the RTWO 110 comprises two conductive rings 112a, 112b. In this way, the oscillation signal of the RTWO 110, and thus the radio frequency signal(s) also generated, is a differential signal. The amplifying cells 111a, 111b, 111c, 111d, 111e, 111f, 111g, 111h are thus electrically connected to the two rings 112a, 112b in a differential arrangement.

Furthermore, the RTWO 110 comprises eight amplifying cells 111a, 111b, 111c, 111d, 111e, 111f, 111g, 111h. However, in general, in such embodiments in which the RTWO 110 comprises two conductive rings, an even number of amplifying cells is implemented. The amplifying cells are connected to both rings in a differential arrangement.

However, in some embodiments, the RTWO 110 comprises a single conductive ring 112a (or 112b). An odd number of amplifying cells is implemented in the RTWO 110. The amplifying cells are connected to the ring in an asymmetrical arrangement.

In some embodiments, the programmable multiplexer device 120 is designed to electrically connect the input port 121 of the system 100 to a single amplifying cell that can be selected from the amplifying cells 111a, 111b, 111c, 111d, 111e, 111f, 111g, 111h.

However, in some embodiments in which the RTWO 110 comprises two conductive rings 112a, 112b, the amplifying cells being electrically connected to both rings 112a, 112b in a differential arrangement, the programmable multiplexer device 120 is designed to electrically connect the input port 121 of the system 100 to:
- a first amplifying cell that can be selected from the amplifying cells electrically connected to both rings 112a, 112b; and
- a second amplifying cell that can be selected from the amplifying cells electrically connected to both rings 112a, 112b.

The second cell is diametrically opposed to the first cell along both rings 112a, 112b. The reference signal $S_{ref}$ injected at the second cell is inverted relative to the reference signal $S_{ref}$ injected at the first cell.

Figure 4:
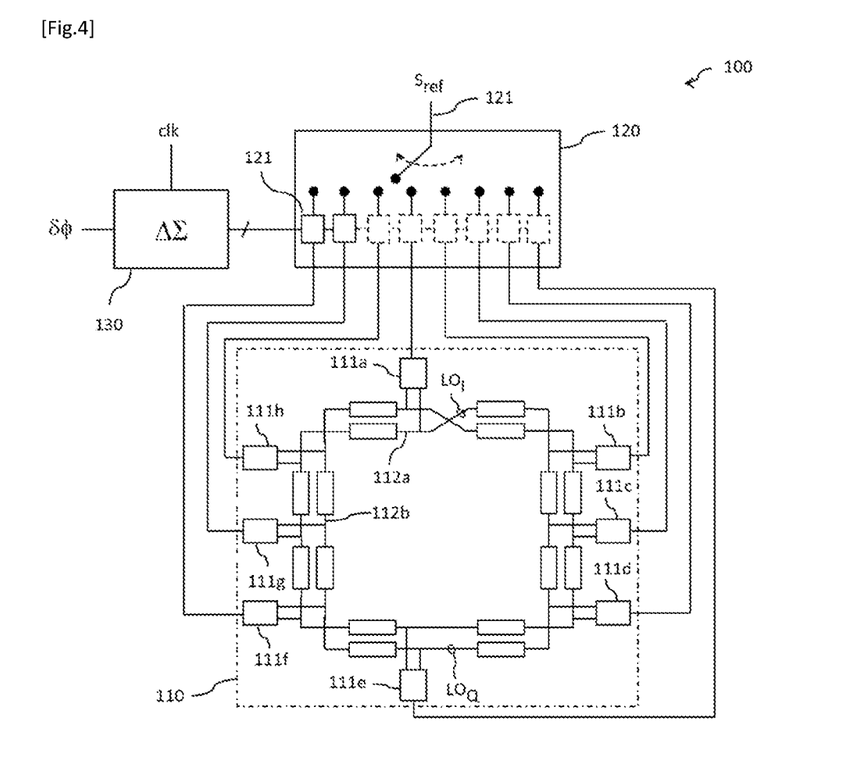
FIG. 4 shows a system for generating a radio frequency signal phase-locked to a reference signal according to another embodiment of the invention.

A system 100 is now presented, with reference to [FIG. 4], for generating a radio frequency signal phase-locked to a reference signal $S_{ref}$ according to another embodiment of the invention. More specifically, the system 100 comprises the elements described above with reference to [FIG. 1] (according to any one of the aforementioned embodiments). According to the present embodiment, the system 100 further comprises a sigma-delta modulator 130 delivering a stream of binary words belonging to a finite set of binary words representing N numerical values (e.g. successive numerical values).

The programmable multiplexer device 120 is designed to electrically connect, as a function of the stream of binary words, the input port 121 to N amplifying cells that can be selected from the amplifying cells 111a, 111b, 111c, 111d, 111e, 111f, 111g, 111h of the RTWO 110, the N amplifying cells being successive cells along the two rings 112a, 112b. N is an integer greater than or equal to two.

Each amplifying cell among the N amplifying cells is associated with a respective value among the N numerical values. The reference signal $S_{ref}$ is injected at a given amplifying cell among the N amplifying cells when a binary word delivered by the sigma-delta modulator 130 represents a value corresponding to the value associated with the given amplifying cell.

The N amplifying cells are thus successively supplied by the reference signal in an order that is a function of the stream of binary words delivered by the sigma-delta modulator 130. To do this, the programmable multiplexer device 120 comprises, for example, switches 121. Such a switch 121 is switched so as to be ON when a binary word delivered by the sigma-delta modulator 130 represents a value corresponding to the value associated with the amplifying cell supplied by the signal controlled via the switch 121 in question.

More specifically, successive supply to the N amplifying cells causes the phase shift to oscillate between different discrete values comprised between two extreme values. Thus, as switching between the various amplifying cells is sufficiently quick in relation to the bandwidth of the injection phenomenon within the RTWO 110, the phase of the oscillation signal stabilizes at an average value. In other words, as a result of the low-pass effect of the RTWO 110 with respect to the injected reference signal $S_{ref}$, a phase increment is thus obtained that is a Op fraction of the phase increment obtained when the reference signal $S_{ref}$ is simply injected into any one of the amplifying cells.

According to the hardware implementation under consideration, the system 100 is designed to generate the phase-locked radio frequency signal(s) when the frequency of the stream of binary words delivered by the sigma-delta modulator 130 is the same as the frequency of the reference signal $S_{ref}$ or an integer sub-multiple of the frequency of the reference signal $S_{ref}$. For example, the frequency of the clock signal clk supplying the sigma-delta modulator 130 is the same as the frequency of the reference signal $S_{ref}$ or an integer sub-multiple of the frequency of the reference signal. $S_{ref}$.

For example, the power consumption of the system is reduced when the frequency of the stream of binary words is the same as an integer sub-multiple of the frequency of the reference signal $S_{ref}$. Conversely, a high frequency of the stream of binary words, for example the same as the frequency of the reference signal $S_{ref}$, reduces the impact of the presence of the sigma-delta modulator 130 on the phase noise of the radio frequency signal generated. In this last case, according to some implementations, the reference signal $S_{ref}$ injected and the clock signal clk supplying the sigma-delta modulator 130 are synchronous. This avoids switching between the different amplifying cells that might occur during the same phase of the reference signal $S_{ref}$. A radio frequency transmitter 500 is now presented, with reference to [FIG. 5], comprising a plurality of systems 100 for generating radio frequency signals phase-locked to a reference signal $S_{ref}$ according to one embodiment of the invention.

Figure 5:
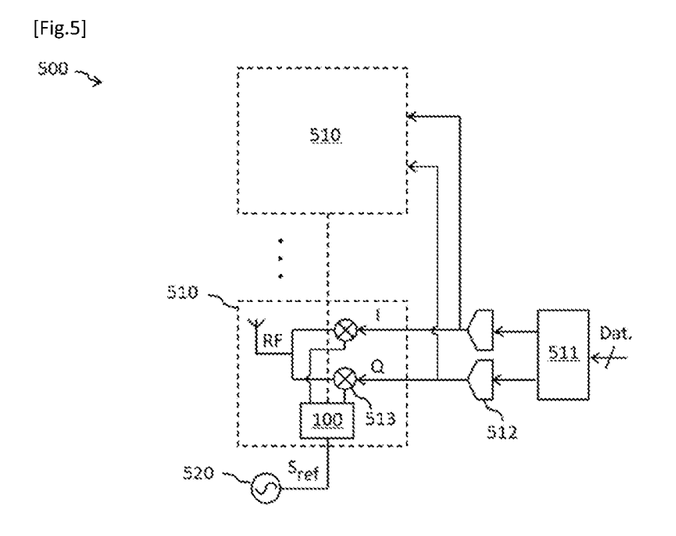
FIG. 5 shows a radio frequency transmitter comprising a plurality of systems for generating radio frequency signals phase-locked to a reference signal according to one embodiment of the invention.

More specifically, such a transmitter 500 comprises a frequency synthesizer 520 delivering the reference signal $S_{ref}$. The transmitter 500 also comprises a plurality of transmission chains 510, each transmission chain 510 comprising:
- a system 100 (according to any one of the aforementioned embodiments) for generating at least one respective radio frequency signal phase-locked to the reference signal $S_{ref}$;
- a frequency transposition device 513 supplied from the at least one respective radio frequency signal and delivering a respective signal to be transmitted from a given low-frequency signal. For example, the device 513 uses two quadrature mixers supplied by radio frequency signals $LO_I$, $LO_Q$ generated by the system 100 as described above with reference to [FIG. 1].

Returning to [FIG. 5], the multiplexer device 120 of the system 100 of each transmission chain 510 is programmed so that the various radio frequency signals generated by the systems 100 of the various transmission chains 510 have a relative phase gradient between them. In this way, transmit beamforming can be achieved simply and efficiently.

Furthermore, the given low-frequency signal is common to the various transmission chains 510. The low-frequency signal in question carries the digital data to be transmitted. Such a low-frequency signal is, for example, generated using a known technique by a device 511 for generating a modulating signal from data bits and converted into the analogue domain by digital-to-analogue converters 512.

Figure 6:
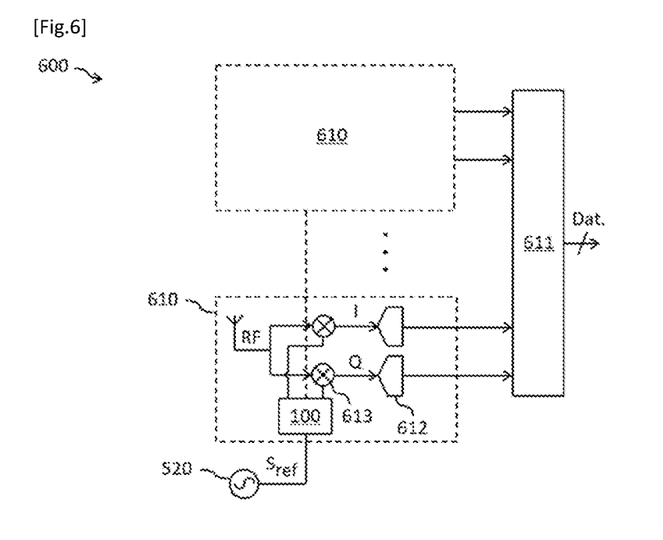
FIG. 6 shows a radio frequency receiver comprising a plurality of systems for generating radio frequency signals phase-locked to a reference signal according to one embodiment of the invention.

A radio frequency receiver 600 is now presented, with reference to [FIG. 6], comprising a plurality of systems 100 for generating radio frequency signals phase-locked to a reference signal $S_{ref}$ according to one embodiment of the invention.

More specifically, such a receiver 600 comprises a frequency synthesizer 520 delivering the reference signal $S_{ref}$. The receiver 600 also comprises a plurality of receiver chains 610, each receiver chain 610 comprising:
- a system 100 (according to any one of the aforementioned embodiments) for generating at least one respective radio frequency signal phase-locked to the reference signal $S_{ref}$;
- a frequency transposition device 613 supplied from the at least one respective radio frequency signal and delivering a respective low-frequency signal from a received signal. For example, the device 613 uses two quadrature mixers supplied by radio frequency signals $LO_I$, $LO_Q$ generated by the system 100 as described above with reference to [FIG. 1].

Returning to [FIG. 6], the multiplexer device 120 of the system 100 of each receiver chain 610 is programmed so that the various radio frequency signals generated by the systems 100 of the various receiver chains 610 have a relative phase gradient between them. In this way, receiver beamforming can be achieved simply and efficiently.

For example, the low-frequency signal delivered by the frequency transposition device 613 of each receiver chain 610 is digitized by respective analogue-to-digital converters 612 before being demodulated by a demodulation device 611 using a known beamforming technique.

The invention claimed is:

1. A system for generating at least one radio frequency signal phase-locked to a reference signal, wherein the system comprises:
   a rotary travelling wave oscillator comprising at least one conductive ring and a plurality of sustaining amplifying cells electrically connected to said at least one ring, a radio frequency length of the ring loaded by an impedance of the amplifying cells corresponding to a frequency of said at least one radio frequency signal;
   a programmable multiplexer device designed to electrically connect an input port of the system to at least one amplifying cell that can be selected from the cells of the plurality,
   the system being designed so that the oscillator generates an oscillation signal phase-locked to the reference signal when the reference signal is injected at the input port of the system, a phase difference between the oscillation signal and the reference signal being a function of said at least one amplifying cell to which the input port is electrically connected via the programming of the multiplexer device, said at least one radio frequency signal corresponding to the oscillation signal picked up at a respective given point of said at least one ring.

2. The system according to claim 1, wherein at least one sustaining amplifying cell comprises a variable capacitance.

3. The system according to claim 1, wherein the amplifying cells are evenly spread along the ring.

4. The system according to claim 1, wherein the oscillator comprises two conductive rings, the plurality of amplifying cells comprising an even number of amplifying cells, the amplifying cells being electrically connected to both rings in a differential arrangement.

5. The system according to claim 4, wherein the programmable multiplexer device is designed to electrically connect the input port of the system to:
   a first amplifying cell that can be selected from the cells of the plurality; and
   a second amplifying cell that can be selected from the cells of the plurality,
   the second cell being diametrically opposed to the first cell along said at least one ring, the reference signal injected at the second cell being inverted relative to the reference signal injected at the first cell.

6. The system according to claim 1, wherein the oscillator comprises a single conductive ring, the plurality of amplifying cells comprising an odd number of amplifying cells, the amplifying cells being connected to the ring in an asymmetrical arrangement.

7. The system according to claim 1, wherein the programmable multiplexer device is designed to electrically connect the input port of the system to a single amplifying cell that can be selected from the cells of the plurality.

8. The system according to claim 1, further comprising a sigma-delta modulator delivering a stream of binary words belonging to a finite set of binary words representing N numerical values, wherein the programmable multiplexer device is designed to electrically connect, as a function of the stream of binary words, the input port of the system to one of the N amplifying cells that can be selected from the cells of the plurality, the N amplifying cells being successive cells along the ring, each amplifying cell among the N amplifying cells being associated with a respective value among the N numerical values, the reference signal being injected at a given amplifying cell among the N amplifying cells when a binary word delivered by the sigma-delta modulator represents a value corresponding to the value associated with the given amplifying cell.

9. A radio frequency transmitter wherein the transmitter comprises:
   a frequency synthesizer delivering a reference signal;
   a plurality of systems according to claim 1, each system generating at least one respective radio frequency signal phase-locked to said reference signal, the multiplexer device of each system being programmed so that the radio frequency signals generated by the various systems of the plurality have a relative phase gradient between them;
   a plurality of frequency transposition devices each supplied from at least one respective radio frequency signal and delivering a respective signal to be transmitted from a given low-frequency signal.

10. The radio frequency receiver wherein the receiver comprises:
- a frequency synthesizer delivering a reference signal;
- a plurality of systems according to claim 1, each system generating at least one respective radio frequency signal phase-locked to said reference signal, the multiplexer device of each system being programmed so that the radio frequency signals generated by the various systems of the plurality have a relative phase gradient between them;
- a plurality of frequency transposition devices each supplied from at least one respective radio frequency signal and delivering a respective low-frequency signal from a received signal.

* * * * *